(12) United States Patent
Nicollini et al.

(10) Patent No.: US 6,697,612 B2
(45) Date of Patent: Feb. 24, 2004

(54) RECEIVING SECTION OF A TELEPHONE

(75) Inventors: Germano Nicollini, Piacenza (IT); Sergio Pernici, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/570,877

(22) Filed: May 15, 2000

(65) Prior Publication Data

US 2003/0190899 A1 Oct. 9, 2003

(30) Foreign Application Priority Data

May 14, 1999 (EP) .............................. 99830297

(51) Int. Cl.[7] ................................. H04B 1/10
(52) U.S. Cl. ........................ 455/310; 455/312
(58) Field of Search .................... 455/234.1, 232.1, 455/200.1, 212, 219, 250, 220, 230, 221, 214, 296, 309, 312, 326, 343, 343.1, 277.1; 330/255, 51

(56) References Cited

U.S. PATENT DOCUMENTS

| | | | | |
|---|---|---|---|---|
| 4,673,889 A | * | 6/1987 | Cini et al. ............... | 330/10 |
| 4,721,923 A | * | 1/1988 | Bares et al. ............. | 330/144 |
| 4,855,685 A | | 8/1989 | Hochschild ............. | 330/282 |
| 4,893,349 A | * | 1/1990 | Eastmond et al. ....... | 455/205 |
| 5,208,865 A | * | 5/1993 | Friske et al. ............ | 381/107 |
| 5,394,476 A | * | 2/1995 | Rollins et al. ........... | 381/104 |
| 5,412,346 A | | 5/1995 | Burger, Jr. et al. ...... | 330/282 |
| 5,821,891 A | * | 10/1998 | Shi et al. ................. | 341/143 |
| 6,154,092 A | * | 11/2000 | Lee et al. ................ | 330/267 |
| 6,172,548 B1 | * | 1/2001 | Cameron et al. ........ | 327/309 |
| 6,316,993 B1 | * | 11/2001 | Hellums .................. | 330/149 |

FOREIGN PATENT DOCUMENTS

| | | | | |
|---|---|---|---|---|
| DE | 4002871 | 1/1991 | ......... | H03F/3/26 |
| JP | 08079338 | 3/1996 | ......... | H04M/1/00 |
| WO | WO 91/07814 | 5/1991 | ......... | H03F/3/45 |

* cited by examiner

*Primary Examiner*—Nay Maung
*Assistant Examiner*—Tan Trinh
(74) *Attorney, Agent, or Firm*—Lisa K. Jorgenson; Allen, Dyer, Doppelt, Milbrath & Gilchrist, P.A.

(57) ABSTRACT

A processing unit with balanced outputs transfers a received digital signal to an amplification unit with balanced inputs and outputs. A control unit enables or disables the processing and amplification units in response to a power up/power down signal. To prevent disturbances due to power up/power down transients from appearing in a speaker connected between the outputs of the amplification unit, switches are provided between the outputs of the processing unit and the inputs of the amplification unit. A delay circuit generates according to a predetermined timing program enabling/disabling control signals for the processing and amplification units, and generates control signals for the switches.

27 Claims, 2 Drawing Sheets

RECEIVING SECTION OF A TELEPHONE

FIELD OF THE INVENTION

The present invention relates to the field of transceivers, and, more particularly, to a receiver section of a telephone.

BACKGROUND OF THE INVENTION

A signal received by a telephone from a digital telephone network is demodulated, processed in digital form, converted to analog form, and is amplified before being applied to an electroacoustic transducer. The receiver section of a telephone can be represented schematically as shown in FIG. 1.

A demodulated digital signal RX-IN produced by a receiving and demodulating unit 10 is applied to the input of a processing unit 11. The processing unit 11 converts the demodulated digital signal to analog form, filters and amplifies the analog signal. The analog signal leaving the processing unit 11 is applied to the input of a power amplifier 12 for transferring the signal to an electroacoustic transducer 13, such as an electromagnetic earphone or speaker, with sufficient electrical power for its operation.

The gain of the power amplifier 12 is determined by the ratio between the resistance of a feedback resistor R2 connected between the output and the inverting input of the amplifier, and by the resistance of a resistor R1 connected between the output of the processing unit 11 and the inverting input of the amplifier.

To prevent the dissipation of power when the telephone is not in use, circuit means are provided both in the processing unit 11 and in the amplifier 12 to respond to an external enabling or disabling command. This function is initiated via a terminal connection of the processing unit 11 and via a terminal connection of the amplifier 12 in response to a digital power down PD signal. The power down PD signal may be a single bit signal. The receiver section is put into a state of zero current absorption when PD=1 (power down), and is enabled to absorb power supply current when PD=0 (power up).

When a change is made from the power down state to the power up state, or vice versa, both the processing unit 11 and the power amplifier 12 are subjected to abrupt voltage and current transients before returning to a normal operating condition. During these transients, electrical disturbances are produced by components having frequencies in the acoustic band, which results in an audible noise in the speaker 13 that may be annoying.

Various arrangements requiring the addition of active or passive components in series and/or in parallel with the speaker 13 for filtering undesired electrical disturbances have been adopted to overcome this problem. This approach, however, requires relatively bulky components outside the power amplifier which may normally be formed as an integrated circuit.

SUMMARY OF THE INVENTION

An object of the present invention is to provide a receiving section for a telephone which is not subject to the problem described above and which can easily be integrated.

This and other objects of the present invention are provided by a receiver section of a telephone comprising a demodulator unit for receiving and demodulating an input signal, and a processor unit for processing the demodulated input signal. The processor unit includes balanced outputs. An amplifier unit including balanced inputs is coupled to the balanced outputs of the processor unit, and the amplifier unit includes balanced outputs coupled to a speaker.

A switch circuit is coupled between the balanced outputs of the processor unit and the balanced inputs of the amplifier unit. A control unit generates a closing control signal for closing the switch circuit according to a predetermined delay with respect to a power up signal for preventing disturbances in the processor unit due to transients of the power up signal from appearing on a processed input signal being applied to the amplifier unit.

BRIEF DESCRIPTION OF THE DRAWINGS

The invention will be more clearly understood from the following detailed description of various embodiments, provided by way of examples, and therefore, without any restrictions, with reference to the attached drawings, in which.

DETAILED DESCRIPTION OF THE PREFERRED EMBODIMENTS

Figure 1:
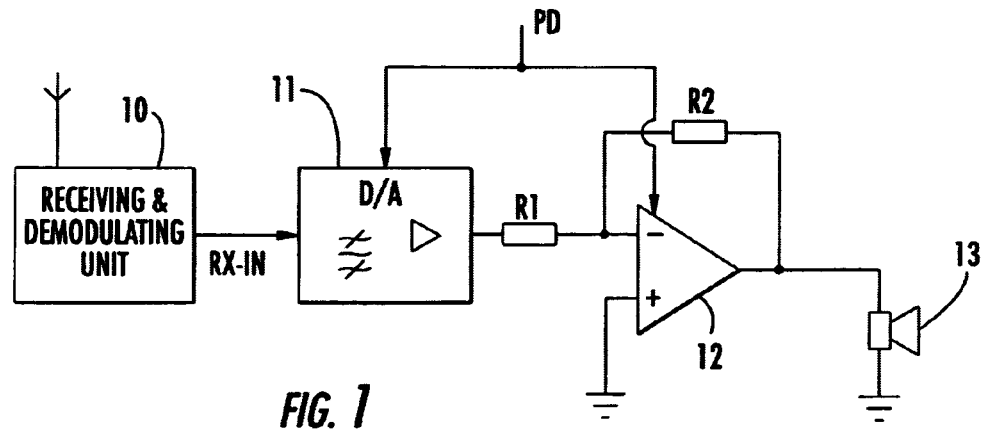
FIG. 1 is a block diagram of a receiver section of a telephone according to the prior art.
Figure 2:
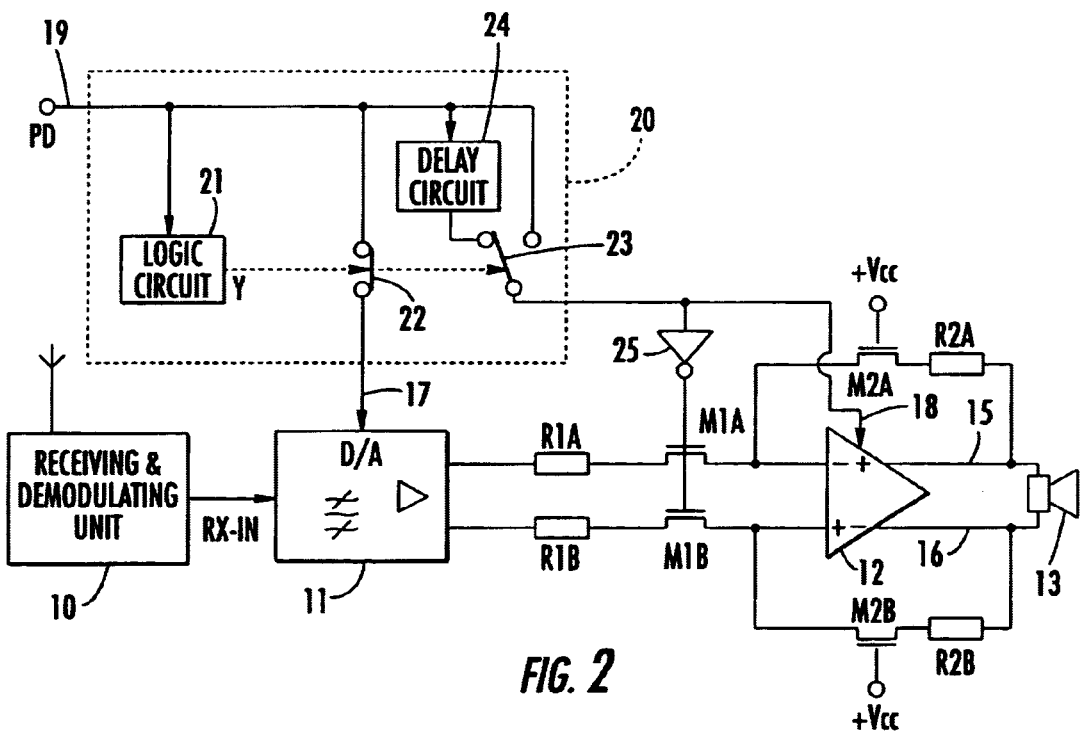
FIGS. 2–4 are block diagrams respectively illustrating an embodiment according to the present invention.

In FIG. 2, elements identical or corresponding to those of FIG. 1 are indicated by the same reference numbers. A processing unit 11 with a balanced structure receives at its input a demodulated digital signal RX-IN, and supplies a balanced analog signal at two outputs. The outputs of the processing unit 11 are coupled to the inputs of a differential amplifier 12. More particularly, each output is connected to one of the inputs of the amplifier through a respective resistor R1A, R1B in series with an n-channel MOS transistor M1A, M1B operating as an electrical switch.

Each of the differential outputs 15, 16 of the amplifier 12 is connected, respectively, to the inverting and non-inverting inputs of the amplifier through a resistor R2A, R2B in series with a MOS transistor M2A, M2B. Each MOS transistor M2A, M2B is biased for conduction. An electroacoustic transducer 13, i.e., a speaker, is connected between the outputs 15, 16 of the differential amplifier 12.

The processing unit 11 and the differential amplifier 12 are supplied power from a voltage source. The processing unit 11 and the differential amplifier 12 each have circuit means which enables or disables the power supply according to a signal applied to respective enabling terminals 17, 18.

A control unit 20 includes a delay circuit 24 and a logic circuit 21, and has an input terminal 19 to which is applied a binary power down PD signal generated by a central circuit control unit (not shown) of the telephone. The logic circuit 21 responds to the power down PD signal by causing the closing or opening of an electrical switch 22 and the closing or opening of an electrical changeover switch 23. The switch 22 connects the terminal 19 to the enabling terminal 17 of the processing unit 11. The changeover switch 23 selectively connects the terminal 19 to the enabling terminal 18 of the differential amplifier 12 directly or through the delay circuit 24.

The changeover switch 23 is used to additionally apply the power down PD signal, directly or through the delay circuit 24, to the gate electrodes of the n-channel MOS transistors M1A and M1B through an inverter 25. The inverter is necessary because the n-channel transistors M1A and M1B must be closed when the amplifier 12 is activated.

Since this happens when the binary power down PD signal is at a low level (PD=0), this signal must be inverted so that it has the necessary positive voltage to operate the n-channel transistors M1A and M1B. If p-channel transistors were used in place of the n-channel transistors, the inverter 25 would not be necessary.

The operation of the circuit will now be considered. The delay circuit 24, the switch 22, the changeover switch 23 and the logic circuit 21 form, in combination, a delay unit which produces control signals according to a predetermined timing program. In particular, the logic circuit 21 produces a signal Y=1 if the power down PD signal is changing from 1 to 0, i.e., from a power down state to a power up state. The logic circuit 21 produces a signal Y=0 if the power down PD signal is changing from the 0 to 1, i.e., from a power up state to a power down state.

When Y=1, the position of the switch 22 and that of the changeover switch 23 are as shown in the drawings. In other words, a 0 signal is applied to the terminal 17 at the instant of the closing of the switch 22, and the 0 signal is applied to the terminal 18 after a period of delay fixed by the delay circuit 24. The delay period is chosen to be sufficiently long to allow the processing unit 11 to settle. Thus the disturbances present at the output of the processing unit 11 have no effect on the amplifier 12 or on the speaker 13 because the amplifier remains off and the transistors M1A and M1B act as open circuits during the settling of the processing unit.

At the end of the delay period fixed by the delay circuit 24, the amplifier 12 is also activated and the outputs of the processing unit 11 are connected to the inputs of the amplifier through the MOS transistors M1A and M1B when they are conducting. Since the input signal of the differential amplifier 12 is stable, any disturbances at the output of the amplifier is limited to the settling of the amplifier 12.

However, since the structure of the amplifier 12 is balanced, the voltages present at the two outputs 15, 16 due to any settling disturbances will be in phase with each other, and therefore, will not have any effect on the differential output signal Vout. Consequently, there will not be any disturbances in the speaker 13.

In the presence of a power down signal (PD from 0 to 1), the signal emitted by the logic circuit 21 is at low level (Y=0). This causes the opening of the switch 22 and the switching of the changeover switch 23. Therefore, the amplifier 12 is disabled, the switches formed by the transistors M1A and M1B are opened and the processing unit 11 is disabled.

The settling of the amplifier 12 has no effect on the output since the structure is a differential amplifier. The processing unit 11 has no effect on the output of the receiver section because the connections between the processing unit 11 and the amplifier 12 are interrupted by the opening of the transistors M1A and M1B. The disabling of the amplifier 12 takes place simultaneously with the disabling of the processing unit 11 to avoid any disturbances in the speaker 13.

The function of the transistors M2A and M2B biased for conduction is to introduce a supplementary resistance into the feedback circuit for the determination of the gain. The transistors M2A and M2B are biased for conduction. The supplementary resistance is equal to that of the transistors M1A and M1B when conducting. The gain of the amplifier 12 is determined from the ratio between the feedback resistance and the resistance in series with the input terminal.

In the design of an integrated circuit, it is not possible to precisely specify the resistance of a single resistor due to the wide variations in the manufacturing parameters, as readily understood by one skilled in the art. However, it is possible to produce two resistors having a precise ratio between their resistances.

The insertion of a respective transistor M1A, M1B in series with each of the inputs, and consequently with the respective resistors, modifies the ratio fixed at the design stage between the feedback resistance and the resistance in series with the inputs. The resistance of each of the conducting transistors M2A, M2B in series with the feedback resistors compensates for this modification of the ratio.

Figure 3:
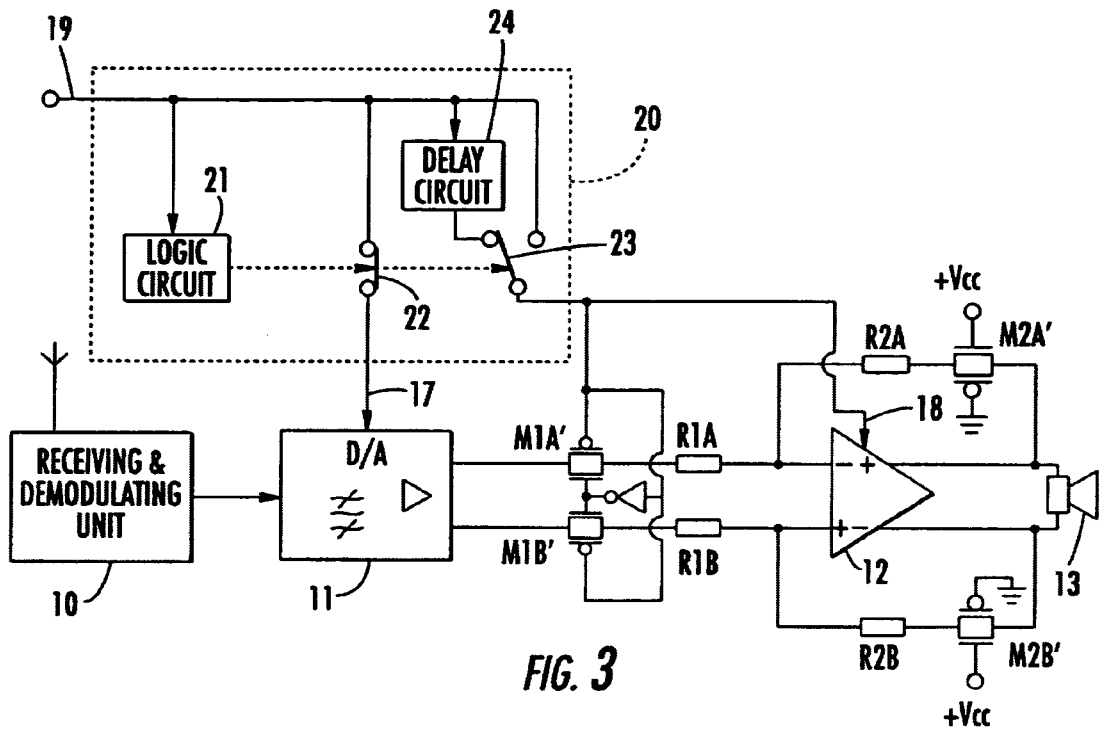

FIG. 3 shows a variation in which the controlled connection between the processing unit 11 and the amplifier 12 is by electrical switches M1A', M1B' connected before the resistors R1A and R1B instead of after them as shown in FIG. 2. In this case, it is preferable for the switch to be formed by pairs of complementary transistors since the dynamic range of the signal is greater than that of the circuit shown in FIG. 2. To compensate the supplementary resistances of the pairs of complementary transistors, pairs of identical transistors M2A' and M2B' are provided in series with the feedback resistors R2A, R2B, and are preferably positioned after them.

Figure 4:
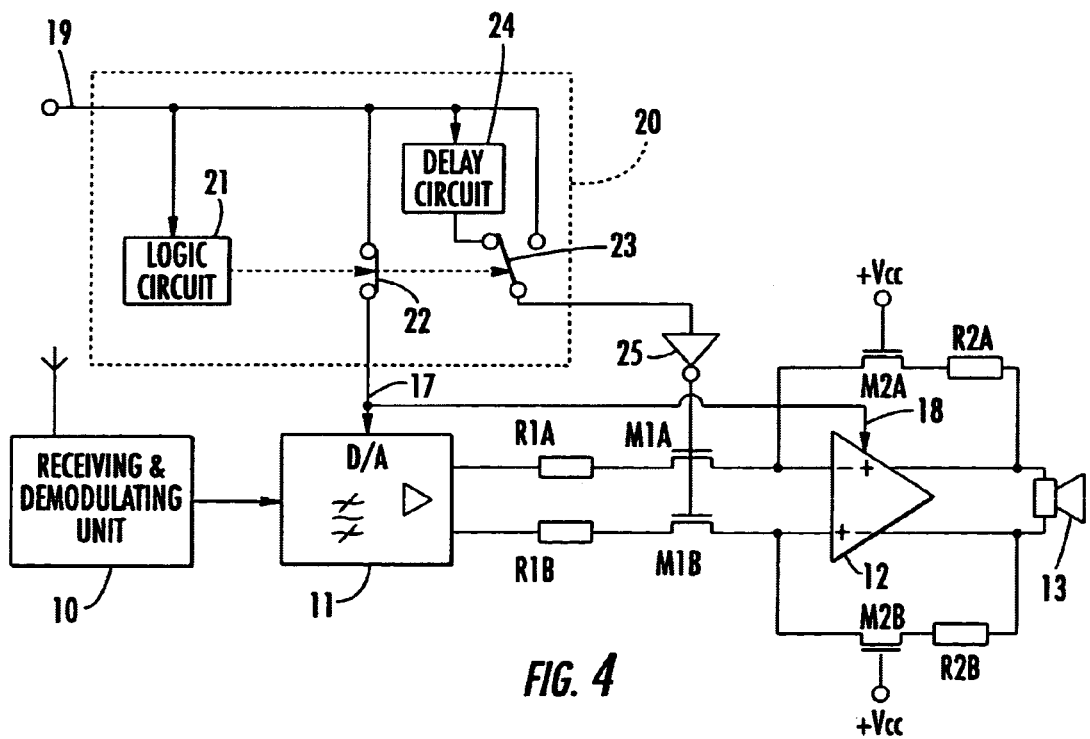

FIG. 4 shows another variation in which the processing unit 11 and the amplifier 12 have their corresponding enabling/disabling terminals 17, 18 both connected to the switch 22 so that they are enabled or disabled simultaneously. This may be done while the control terminals of the transistors M1A, M1B are connected through the inverter 25 to the changeover switch 23 as shown in FIG. 2.

With this configuration, the power-up time of the receiver section is shorter than that of the embodiment shown in FIG. 2. This is so since the power-up time is not the sum of the power-up time of the processing unit 11, the delay period of the circuit 24, and that of the amplifier 12. Instead, the power-up time is determined by the delay period of the delay circuit 24, i.e., by the settling time of the processing unit 11.

The receiving section according to the present invention makes it possible to avoid disturbance in the speaker 13 since the propagation of the signal during the settling transients is substantially blocked. This is achieved without bulky external components, and is accomplished by using a few supplementary components which can easily be integrated.

That which is claimed is:
1. A receiver section of a telephone comprising:
   a demodulator unit for receiving and demodulating an input signal;
   a processor unit for processing the demodulated input signal, said processor unit including balanced outputs;
   a speaker;
   an amplifier unit including balanced inputs coupled to the balanced outputs of said processor unit, and balanced outputs coupled to said speaker for providing an amplified input signal thereto; and
   a switch circuit for selectively coupling the balanced outputs of said processor unit to the balanced inputs of said amplifier unit based upon a closing control signal; and
   a control unit for generating the closing control signal for closing said switch circuit according to a predetermined delay with respect to a power up signal for preventing disturbances in said processor unit, due to transients of the power up signal, from appearing on a processed input signal being applied through said switch circuit to said amplifier unit.

2. A receiver section according to claim 1, wherein said control unit further responds to the power up signal by generating and applying an enabling control signal to enabling inputs of said processor unit and said amplifier unit; and wherein said control unit responds to a power down signal by generating a disabling control signal for the enabling inputs of said processor unit and said amplifier unit.

3. A receiver section according to claim 2, wherein said control unit further responds to the power down signal by generating an open control signal for opening said switch circuit, the open control signal being substantially synchronous with the disabling control signal.

4. A receiver section according to claim 1, wherein said delay circuit further responds to the power up signal by generating a first enabling control signal for an enabling input of said processor unit, by generating a second enabling control signal for an enabling input of said amplifier unit, the second enabling control signal being generated according to the predetermined delay with respect to the power up signal; and wherein said control unit responds to a power down signal by generating a disabling control signal for the enabling inputs of said processor unit and said amplifier unit.

5. A receiver section according to claim 4, wherein said control unit further responds to the power down signal with an opening control signal for opening said switch circuit, the opening control signal being approximately synchronous with the disabling control signal.

6. A receiver section according to claim 1, wherein said amplifier unit comprises a differential amplifier; and said receiver section further comprising:
   a first resistance network coupled between the balanced inputs and the balanced outputs of said differential amplifier for determining a gain thereof, said first resistance network comprising a resistor and a switch coupled thereto between each respective input and output of said differential amplifier, the switch having the same resistance as said switch circuit coupled to each respective input when in a closed state; and
   a second resistance network comprising a resistor coupled in series with each respective input of said differential amplifier.

7. A receiver section according to claim 6, wherein said switch circuit is between the balanced inputs of said differential amplifier and the corresponding second resistive network; and wherein each switch of said first resistance network is coupled between a respective resistor and input of said differential amplifier.

8. A telephone comprising:
   a receiver comprising
      a processor unit for processing an input signal,
      an amplifier unit coupled to said processor unit for amplifying the input signal,
      a speaker coupled to an output of said amplifier unit,
      a switch circuit for selectively coupling said processor unit to said amplifier unit based upon a closing control signal, and
      a control unit for generating the closing control signal for said switch circuit according to a predetermined delay with respect to a power up signal for preventing disturbances in said processor unit due to power up transients from appearing on a processed input signal being applied through said switch circuit to said amplifier unit.

9. A telephone according to claim 8, wherein said control unit further generates an enabling control signal for enabling said processor unit and said amplifier unit in response to the power up signal.

10. A telephone according to claim 8, wherein said control unit responds to a power down signal by generating a disabling control signal for disabling said processor unit and said amplifier unit.

11. A telephone according to claim 10, wherein said control unit further responds to the power down signal by generating an opening control signal for opening said switch circuit, the open control signal being substantially synchronous with the disabling control signal.

12. A telephone according to claim 8, further comprising a demodulator unit coupled to said processor unit for demodulating the input signal.

13. A telephone according to claim 8, wherein said processor unit includes balanced outputs; and wherein said amplifier unit includes balanced inputs coupled to the balanced outputs of said processor unit, and said amplifier unit includes balanced outputs coupled to said speaker.

14. A telephone according to claim 13, wherein said amplifier unit comprises a differential amplifier; and said receiver further comprising:
   a first resistance network coupled between the balanced inputs and the balanced outputs of said differential amplifier for determining a gain thereof, said first resistance network comprising a resistor and a switch coupled thereto between each respective input and output of said differential amplifier, the switch having the same resistance as said switch circuit coupled to each respective input when in a closed state; and
   a second resistance network comprising a resistor coupled in series with each respective input of said differential amplifier.

15. A telephone according to claim 14, wherein said switch circuit is between the balanced inputs of said differential amplifier and the corresponding second resistive network; and wherein each switch of said first resistance network is coupled between a respective resistor and input of said differential amplifier.

16. A telephone comprising:
   a receiver comprising
      a processor unit,
      an amplifier unit coupled to said processor unit,
      a speaker coupled to an output of said amplifier unit,
      a switch circuit for selectively coupling said processor unit to said amplifier unit based upon a closing control signal, and
      a control unit for generating a first control signal for enabling said processor unit and a second control signal for enabling said amplifier unit in response to a power up signal, and for generating a the closing control signal for said switch circuit, the second enabling control signal and the closing control signal being generated according to a predetermined delay with respect to the power up signal for preventing disturbances in said processor unit due to power up transients from appearing on the processed input being applied through said switch circuit to said amplifier unit.

17. A telephone according to claim 16, wherein said control unit responds to a power down signal by generating a disabling control signal for said processor unit and said amplifier unit.

18. A telephone according to claim 17, wherein said control unit further responds to the power down signal with an opening control signal for opening said switch circuit, the opening control signal being approximately synchronous with the disabling control signal.

19. A telephone according to claim 16, further comprising a demodulator unit coupled to said processor unit for receiving and demodulating an input signal.

20. A telephone according to claim 16, wherein said processor unit includes balanced outputs; and wherein said amplifier unit includes balanced inputs coupled to the balanced outputs of said processor unit, and said amplifier unit includes balanced outputs coupled to said speaker.

21. A telephone according to claim 16, wherein said amplifier unit comprises a differential amplifier; and said receiver further comprising:

a first resistance network coupled between the balanced inputs and the balanced outputs of said differential amplifier for determining a gain thereof, said first resistance network comprising a resistor and a switch coupled thereto between each respective input and output of said differential amplifier, the switch having the same resistance as said switch circuit coupled to each respective input when in a closed state; and a second resistance network comprising a resistor coupled in series with each respective input of said differential amplifier.

22. A telephone according to claim 21, wherein said switch circuit is between the balanced inputs of said differential amplifier and the corresponding second resistive network; and wherein each switch of said first resistance network is coupled between a respective resistor and input of said differential amplifier.

23. A method for preventing disturbances due to power up transients in a receiver of a telephone from appearing on an amplified input signal being applied to a speaker therein, the method comprising:

demodulating the input signal;

processing the demodulated input signal for providing a processed input signal;

amplifying the processed input signal for providing the amplified input signal to the speaker; and generating a closing control signal for closing a switch circuit receiving the processed input signal, the switch circuit for selectively conducting therethrough the processed input signal based upon the closing control signal, the closing control signal being generated according to a predetermined delay with respect to a power up signal for preventing disturbances due to power up transients from appearing on the processed input signal before being amplified for the speaker.

24. A method according to claim 23, further comprising generating and applying in response to the power up signal an enabling control signal for enabling a processor unit processing the demodulated input signal and an amplifier unit amplifying the processed input signal; and generating a disabling control signal in response to a power down signal for disabling the processor unit and the amplifier unit.

25. A method according to claim 24, wherein generating the disabling control signal further comprises generating an opening control signal for opening the switch circuit, the opening control signal being substantially synchronous with the disabling control signal.

26. A method according to claim 23, further comprising:

generating in response to the power up signal a first enabling control signal for a processor unit processing the demodulated input signal;

generating in response to the power up signal a second enabling control signal for an amplifier unit amplifying the processed input signal, the second enabling control signal being generated according to the predetermined delay with respect to the power up signal; and generating a disabling control signal in response to a power down; signal for disabling the processor unit and the amplifier unit.

27. A method according to claim 26, further comprising generating an opening control signal in response to the power up signal for opening the switch circuit, the opening control signal being approximately synchronous with the disabling control signal.

* * * * *